(12) United States Patent
Yoshida

(10) Patent No.: US 6,846,193 B2
(45) Date of Patent: Jan. 25, 2005

(54) SOCKET

(75) Inventor: Eiji Yoshida, Tokyo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/426,658

(22) Filed: May 1, 2003

(65) Prior Publication Data
US 2004/0127075 A1 Jul. 1, 2004

(30) Foreign Application Priority Data
Dec. 27, 2002 (JP) .......................... 2002-378903

(51) Int. Cl.$^7$ .............................................. H01R 11/22
(52) U.S. Cl. ......................................... 439/266; 439/70
(58) Field of Search ............................... 439/266, 263, 439/264, 267, 331, 70, 71, 72, 73, 330, 265; 324/755, 758, 761, 754

(56) References Cited

U.S. PATENT DOCUMENTS 5,288,240 A * 2/1994 Savant ........................ 439/266
5,683,262 A * 11/1997 Matsuoka et al. ............ 439/266
6,350,137 B1 * 2/2002 Shimada ..................... 439/266

FOREIGN PATENT DOCUMENTS

JP          11-111759           4/1999

* cited by examiner

Primary Examiner—Alex Gilman
(74) Attorney, Agent, or Firm—Oblon, Spivak, McClelland, Maier & Neustadt, P.C.

(57) ABSTRACT

The present invention provides a socket capable of attaching an IC chip in such a manner that a rear face of the IC chip faces a detector side. By fitting the shape of a package lead (10) into the shape of a positioning structure (6), a package (9) is positioned at and housed in a predetermined portion inside a housing part (2). The package (9) is housed in such a manner that a rear face (9b) thereof faces upwardly. The package lead (10) is pressed by one end (3a1) of a top portion (3a) of a socket lead (3), and is also sandwiched between the socket lead (3) and a upper face of a protrusion (6a) of the positioning structure (6) in the vertical direction. As a result, the socket lead (3) and package lead (10) are securely brought into contact with each other, and the package (9) and a socket base (1) are mutually fixed.

11 Claims, 10 Drawing Sheets

SOCKET

BACKGROUND OF THE INVENTION

1. Field of the Invention

The present invention relates to a socket used for an evaluation device and an analyzing device of a semiconductor device.

2. Description of the Background Art

Conventionally, when failure analysis and performance evaluation are performed on a semiconductor device, the semiconductor device is actually operated by applying a test pattern from a signal generator to the semiconductor device, while an electron beam is also applied onto the top face of the semiconductor device so that an secondary electron image is observed by detecting secondary electrons generated from the top face by using a detector. Moreover, light emission/heat generating analysis and an analysis using a laser and the like have been performed through an approach from the top face of a semiconductor device. Here, the semiconductor device is molded in an IC chip, and a package into which the IC chip is sealed by resin is attached to a socket (hereinafter, referred to as "top face exposed-type socket" in this specification) in such a manner that a top face of the package faces upward (that is, facing the detector side).

However, along with the developments of a wire layer structure having multiple layers and various types of semiconductor devices such as LOC (Lead On Chip), CSP (Chip Scale Package) and Flip Chip BGA, it becomes difficult to accurately perform the failure analysis or the like through an approach from the top face of IC chips. For this reason, in recent years, the failure analysis or the like is performed through an approach from the rear face of IC chips.

Here, a technique relating to failure analyses of semiconductor devices has been disclosed in, for example, the Japanese Patent Application Laid-Open No. 11-111759 (1999).

Conventionally, when failure analysis or the like is performed on a general-purpose package such as a QFP (Quad Flat Package), SOP (Small Outline Package) and DIP (Dual Inline Package) through an approach from the rear face of a chip, a method has been used in which the chip rear face is exposed by machining the rear face of the top face exposed-type socket to form an opening therein. However, the problem with this method is that it sometimes becomes difficult or impossible to perform the machining process to form an opening due to socket leads that cause hindrance. Moreover, even in the case when the chip rear face is exposed, since the distance from the rear face of the socket to the rear face of the chip is long, it is not possible to use a recently-developed high-performance detector having a working distance of not more than 1 mm.

Another method has been proposed in which lead wires are directly connected to the package leads by using solder or clips. However, in this method, it becomes impossible to connect lead wires to all the leads of a recently-developed package having a several hundreds pins with narrow pitches, resulting in a failure to actually operate the semiconductor device appropriately. Moreover, as the number of lead wires increases, the lead wires come to cover the IC chip, with the result that it is not possible to use a high-performance detector having a working distance of not more than 1 mm in the same manner as described above.

SUMMARY OF THE INVENTION

An object of the present invention is to provide a socket capable of attaching a package in such a manner that a rear face of the package faces the detector side.

According to a first aspect of the present invention, a socket includes a socket base, a housing part, a socket lead, a socket lever and a socket lid. The housing part is formed inside a top face of the socket base. A package into which an IC chip is sealed is to be housed in the housing part in such a manner that a rear face of the package faces upwardly. The socket lead is arranged along the periphery of the housing part, and has elasticity in a predetermined direction. The socket lever has one end meshed with the socket lead. The socket lid shifts the socket lead toward the outside of the socket base by pressing the other end of the socket lever.

With this configuration, it becomes possible to perform failure analysis and evaluation on a semiconductor device through an approach from the chip rear face, without the necessity of machining the rear face of the top face exposed-type socket to form an opening therein or connecting the lead wires to the package leads by using solder or clips. Moreover, since all the package leads can be connected to the socket leads, it becomes possible to actually operate the semiconductor device appropriately. Furthermore, since the detector can be driven to a distance close to the chip rear face, it becomes possible to perform analysis and evaluation with high precision by using a high-performance detector having a working distance of not more than 1 mm.

According to a second aspect of the present invention, a socket includes a socket base, a housing part, a socket lead, a socket lever and a socket lid. The housing part is formed inside a top face of the socket base. A package into which an IC chip is sealed is to be housed in the housing part. The socket lead is arranged along the periphery of the housing part, and elastically recovers in a package lead direction. The socket lever is detachably attached to the socket base, and has one end meshed with the socket lead. The socket lid is detachably attached to the socket base, and presses the other end of the socket lever in order to shift the socket lead toward the outside of the socket base.

With this configuration, it becomes to possible to observe the chip rear face by a detector with the socket lid and the socket removed from the socket base. Therefore, it becomes possible to perform analysis and evaluation with high precision by using a high-performance detector having a working distance of not more than 1 mm.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
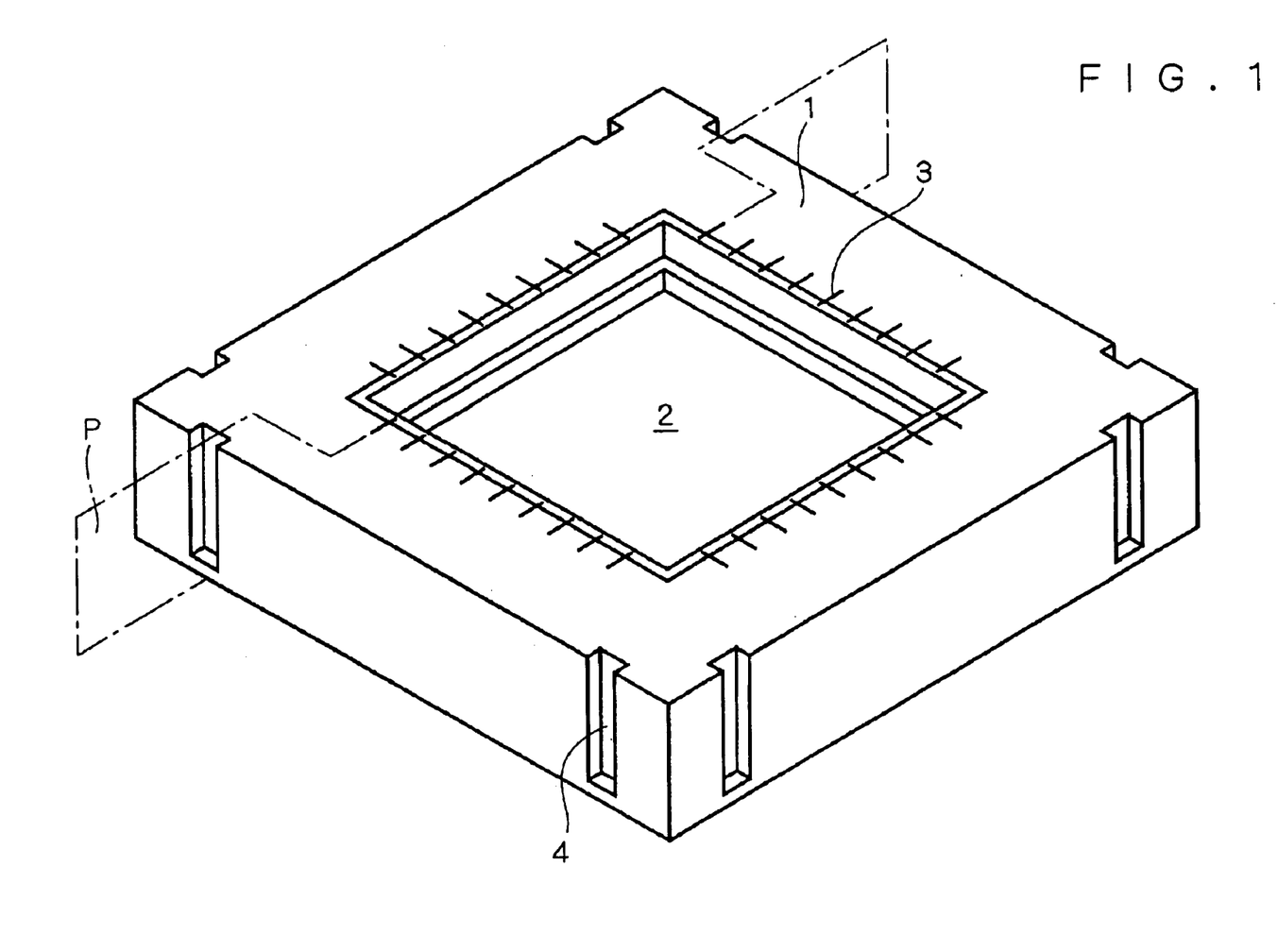
FIG. 1 is a perspective view schematically showing a structure of a socket according to a first embodiment of the present invention.

FIG. 1 is a perspective view schematically showing a structure of a socket according to a first embodiment of the present invention. A housing part 2 for housing a package into which an IC chip is sealed by resin is formed within a top face of a socket base 1. The housing part 2 is formed at the center of the top face of the socket base 1. A plurality of socket leads 3 made of metal are arranged along the periphery of the housing part 2. A plurality of grooves 4 are formed in a side face of the socket base 1.

Figure 2:
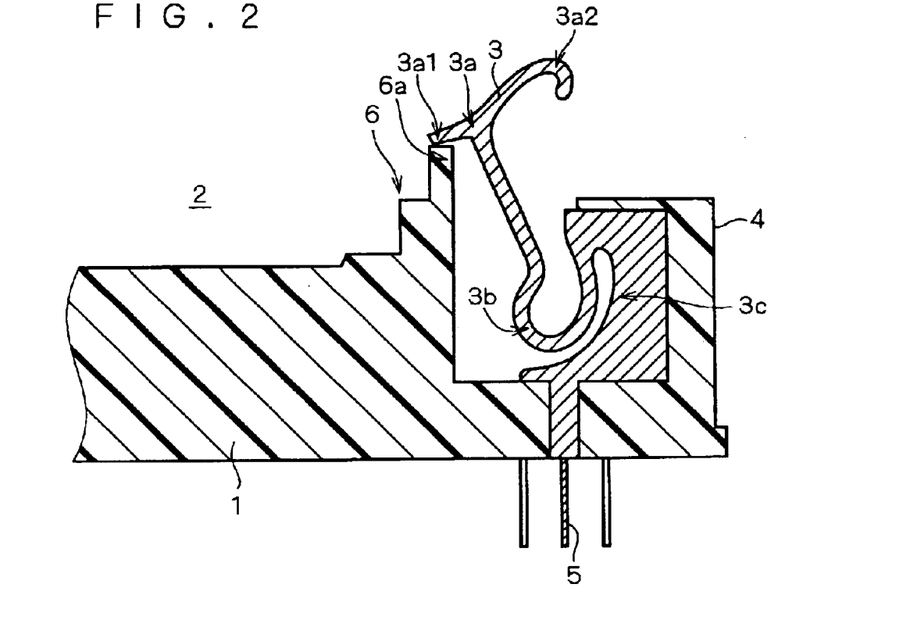
FIGS. 2 to 8 sequentially show a process of housing a package in a housing part.
Figure 3:
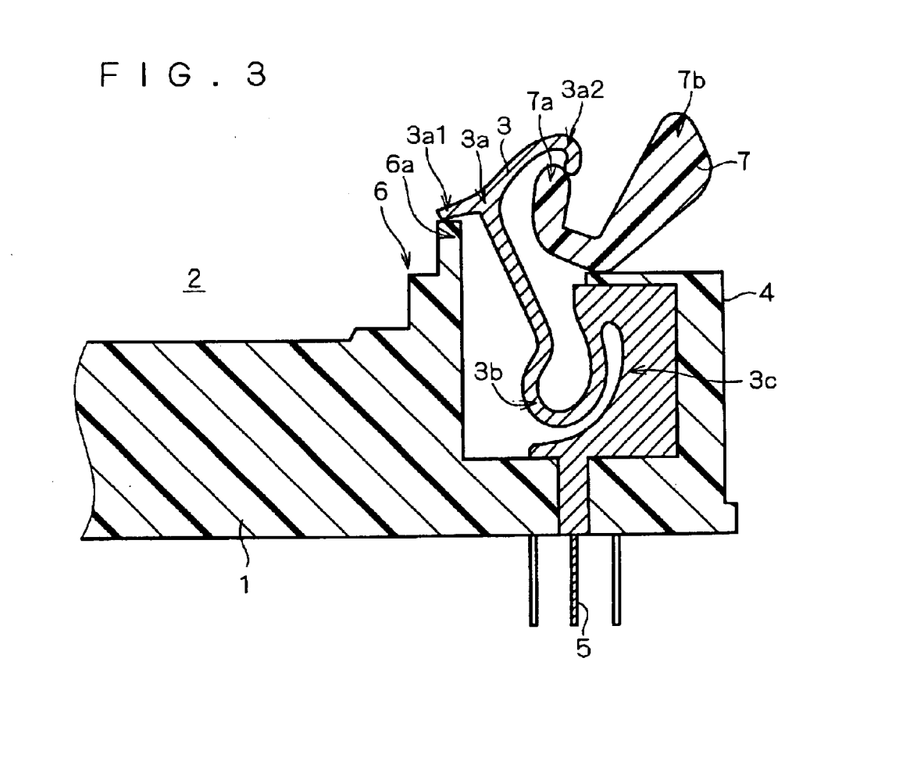
Figure 4:
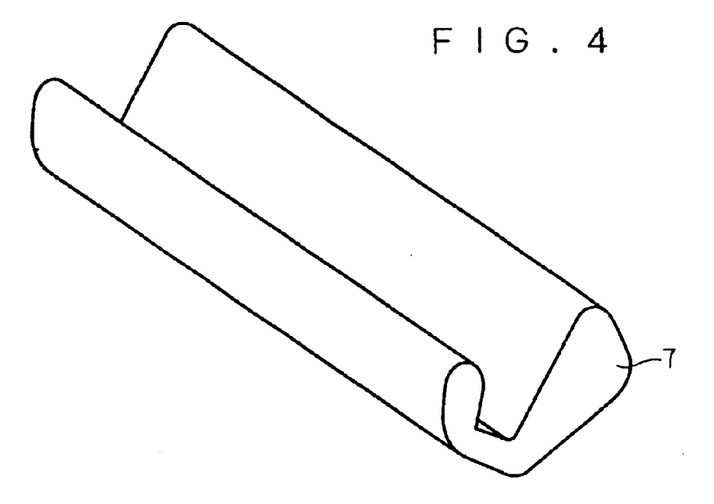
Figure 5:
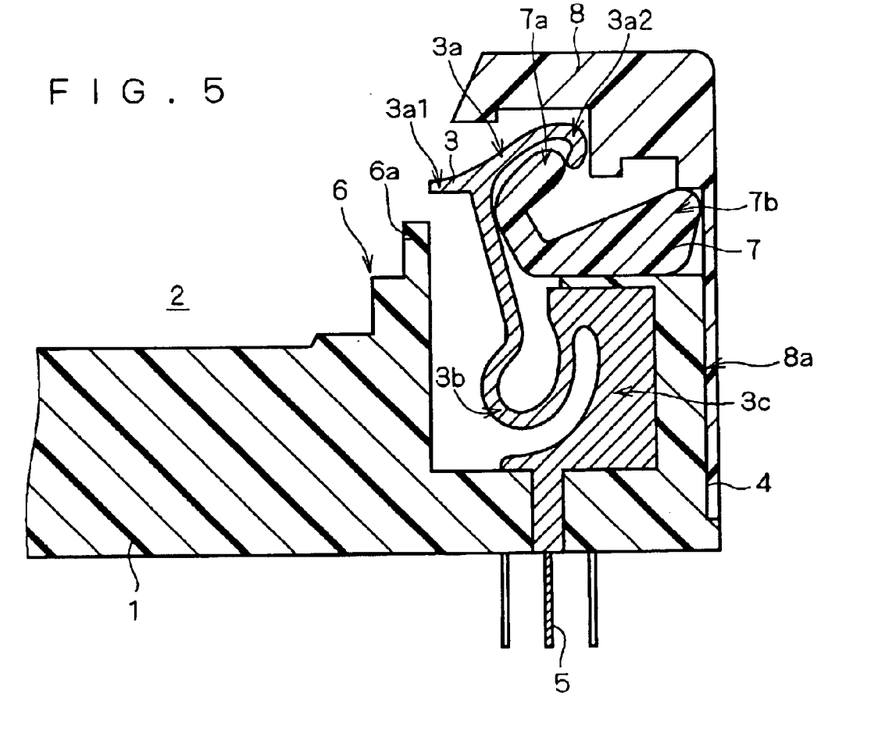
Figure 6:
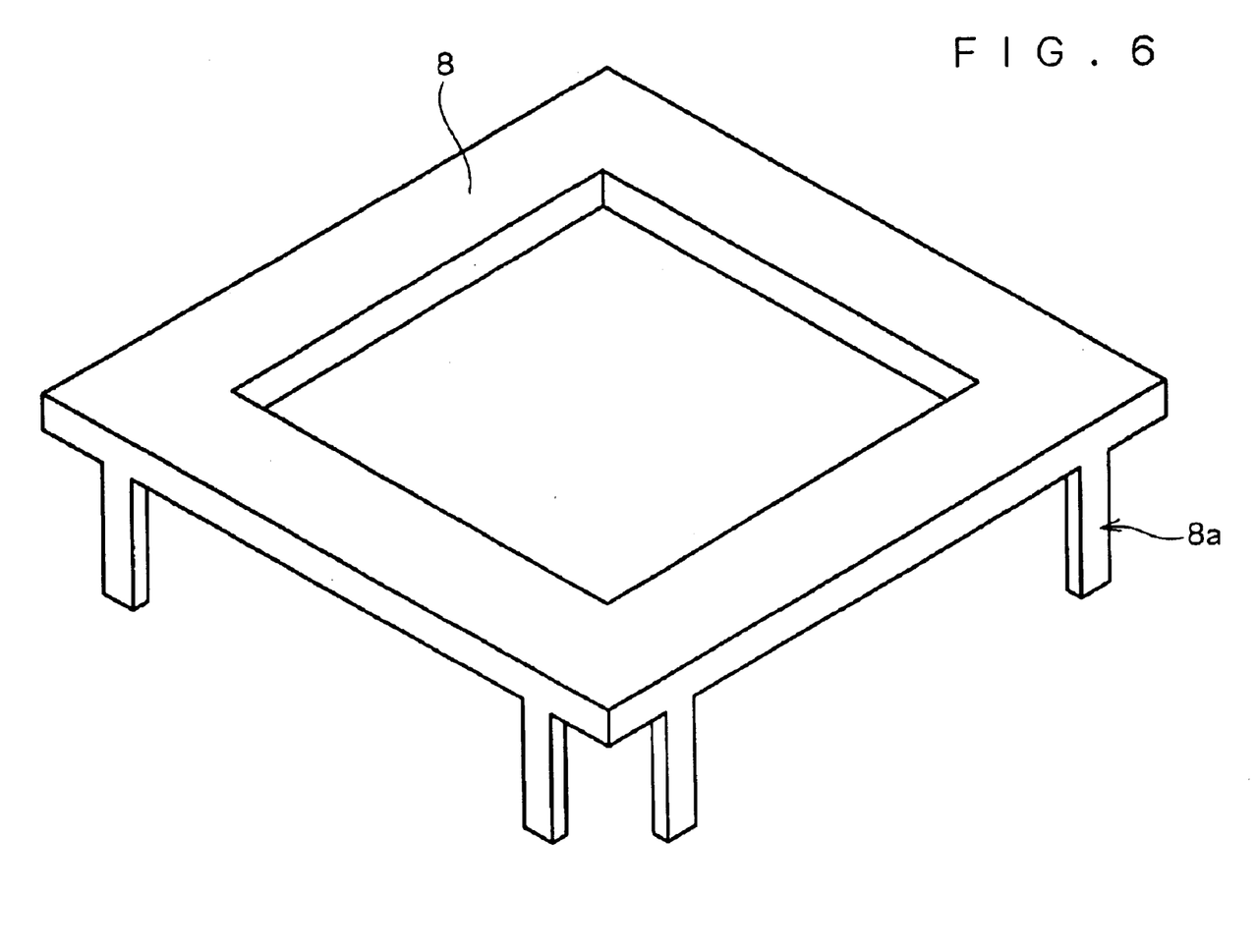

FIGS. 2 to 8 sequentially show a process of housing a package 9 in the housing part 2. In particular, FIGS. 2, 3, 5, 7 and 8 are cross-sectional views each showing the socket in a partially enlarged manner on the assumption that the socket is cut by a hypothetical face P shown in FIG. 1. FIG. 4 is a perspective view showing a structure of a socket lever 7, and FIG. 6 is a perspective view showing a structure of a socket led 8.

As shown in FIG. 2, the socket lead 3 has a top portion 3a, a curved portion 3b and a base portion 3c. The base portion 3c is fixed to the socket base 1. Due to the provision of the curved portion 3b, the socket lead 3 has elasticity in a predetermined direction (horizontal direction in FIG. 2). On a side wall portion of the housing part 2, a positioning structure 6 for specifying the housing position of the package is formed on the socket base 1. In a state shown in FIG. 2, one end 3a1 of a top portion 3a of the socket lead 3 is brought into contact with or placed close to the top face of a protrusion 6a of the positioning structure 6. A lead terminal 5 made of metal, which is connected to the socket lead 3, is formed on the bottom face of the socket base 1.

With reference to FIG. 3, the socket lever 7 is placed in such a manner as to mesh with the socket lead 3. More specifically, the other end 3a2 of the top portion 3a of the socket lead 3 is meshed with one end 7a of the socket lever 7. As shown in FIG. 1, the top face (opening face) of the housing part 2 is defined by four sides on the top face of the socket base 1. The rod-shaped socket lever 7 shown in FIG. 4 is placed in correspondence with each of the four sides.

With reference to FIG. 5, the other end 7b of the socket lever 7 is pressed down by using the socket lid 8. Then, the other end 3a2 of the top portion 3a of the socket lead 3 is pulled outward (in the right direction in FIG. 5) with respect to the socket base 1 by one end 7a of the socket lever 7. In response to this, one end 3a1 of the top portion 3a of the socket lead 3 is also shifted rightward (more strictly, upward right direction) in FIG. 5. In a state after the shift shown in FIG. 5, it is desirable that the left end of the one end 3a1 of the top portion 3a of the socket lead 3 is positioned on the right side from the right end of the protrusion 6a of the positioning structure 6.

With reference to FIG. 6, a plurality of protrusions 8a are formed on the socket lid 8 in association with the grooves 4 of the socket base 1 (see FIG. 1). The protrusions 8a are guided by the grooves 4, so that the socket lid 8 is allowed to cover a predetermined portion on the socket base 1.

Figure 7:
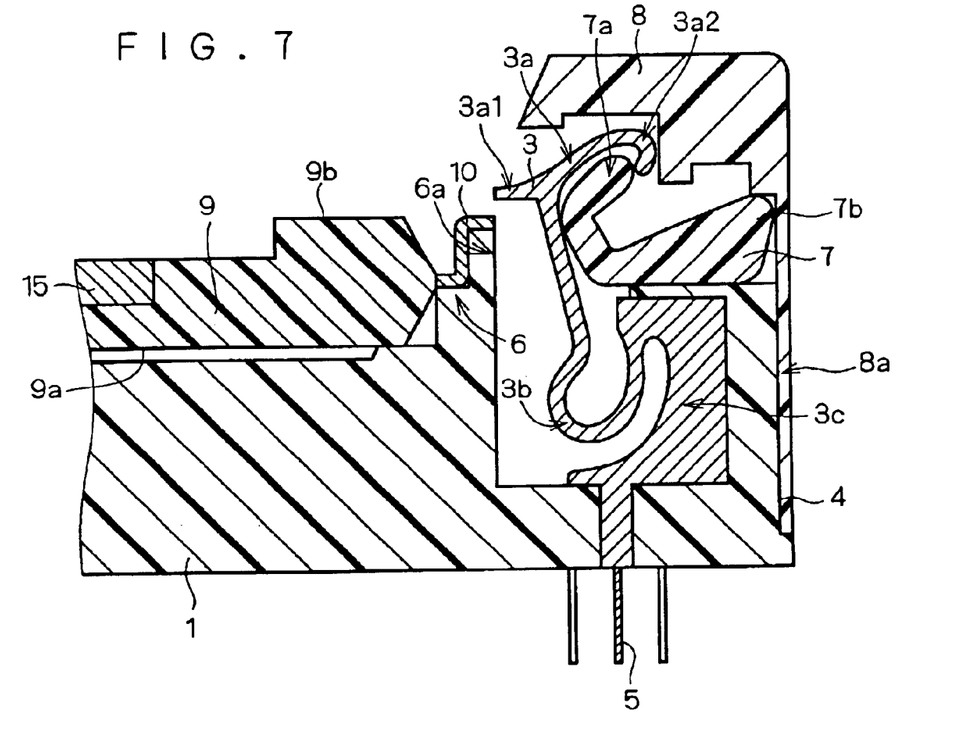

With reference to FIG. 7, the package 9 into which an IC chip 15 is sealed by resin is housed in the housing part 2 from the upper side of the socket base 1. A package lead 10 made of metal protrudes from the side face of the package 9. The shape of the package lead 10 is fitted to the shape of the positioning structure 6, so that the package 9 is positioned at and housed in a predetermined portion inside the housing part 2. As shown in FIG. 7, the package 9 is housed in such a manner that a rear face 9b thereof faces upwardly. An opening is partially formed in the rear face 9b of the package 9 through a machining process and a chemical process, whereby a rear face of the IC chip 15 is preliminarily exposed. Moreover, the rear face of the IC chip 15 is preliminarily polished.

Figure 8:
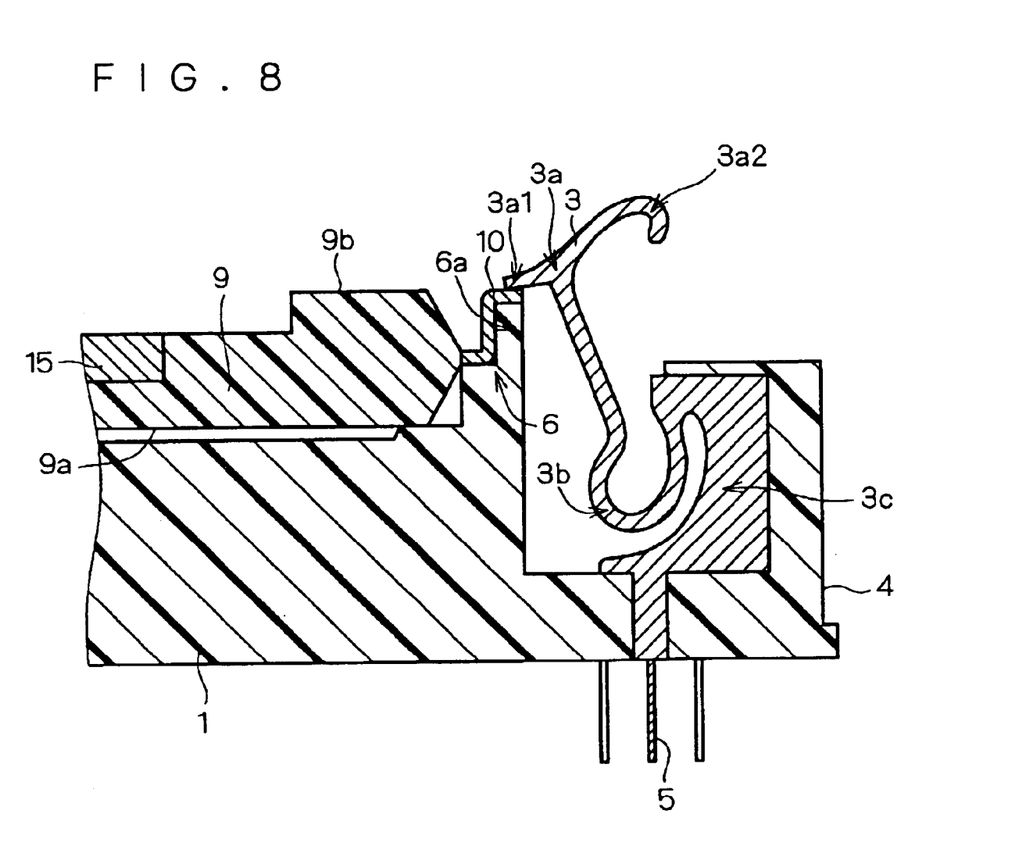

With reference to FIG. 8, the socket lid 8 and the socket lever 7 are removed from the socket base 1. Then, the elastic recovering force of the socket lead 3 allows one end 3a1 of the top portion 3a of the socket lead 3 to shift leftward (more strictly, in the downward left direction) of FIG. 8. Thus, the package lead 10 is pressed by the one end 3a1 of the top face 3a of the socket lead 3, and is also sandwiched between the socket lead 3 and the top face of the protrusion 6a of the positioning structure 6 in the vertical direction. As a result, the socket lead 3 and the package lead 10 are securely brought into contact with each other, and the package 9 and the socket base 1 are mutually fixed.

Figure 9:
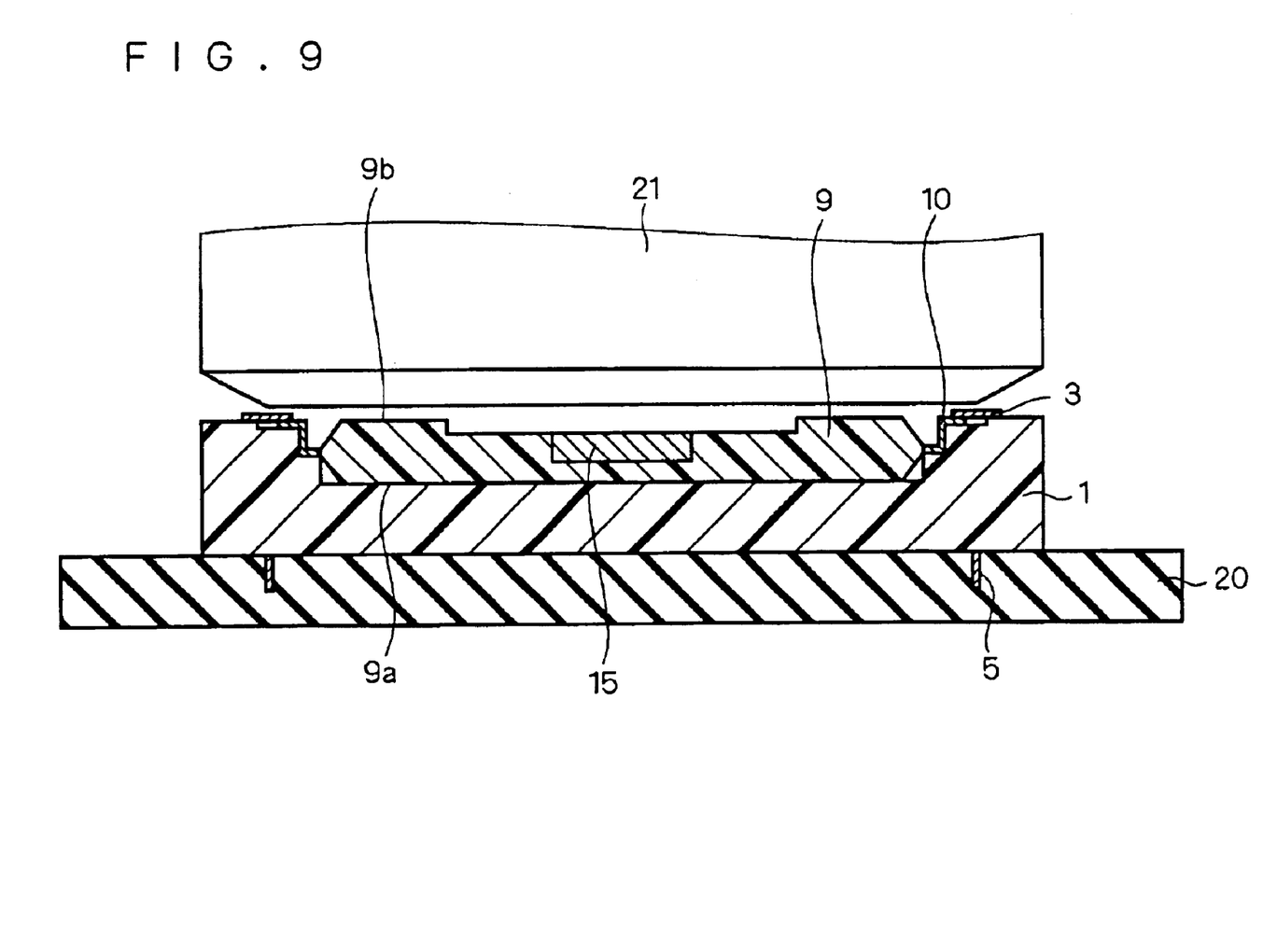
FIG. 9 is a cross-sectional view showing a state where failure analysis is performed on a semiconductor device by using the socket according to the first embodiment of the present invention.

FIG. 9 is a cross-sectional view showing a state where failure analysis is performed on a semiconductor device by using the socket according to the first embodiment. The semiconductor device to be subjected to the failure analysis is assembled in the IC chip 15. The socket to which the package 9 is attached is mounted on a test board substrate 20. A test pattern is applied to the semiconductor device from a signal generator (not shown) through a test board substrate 20, a lead terminal 5, the socket lead 3 and the package lead 10 in this order. With this structure, the semiconductor device is actually operated. In addition, an electron beam is applied to the read face of the IC chip 15 so that secondary electrons generated from the read face of the IC chip 15 are detected by a detector (objective lens) 21, whereby a secondary electron image is observed.

In the socket according to the first embodiment, the package 9 is housed inside the housing part 2 in such a manner that a rear face 9b thereof faces upwardly (i.e., facing the detector 21 side). Therefore, it becomes possible to perform failure analysis and performance evaluation on the semiconductor device by using an approach from the rear face of the IC chip 15, without the necessity of machining the rear face of the top face exposed-type socket to form an opening therein or connecting the lead wires to the package leads by using solder or clips. Moreover, in the similar manner to the conventional top face exposed-type socket, all the package leads 10 can be connected to the socket leads 3 so that it becomes possible to actually operate the semiconductor device appropriately.

Figure 10:
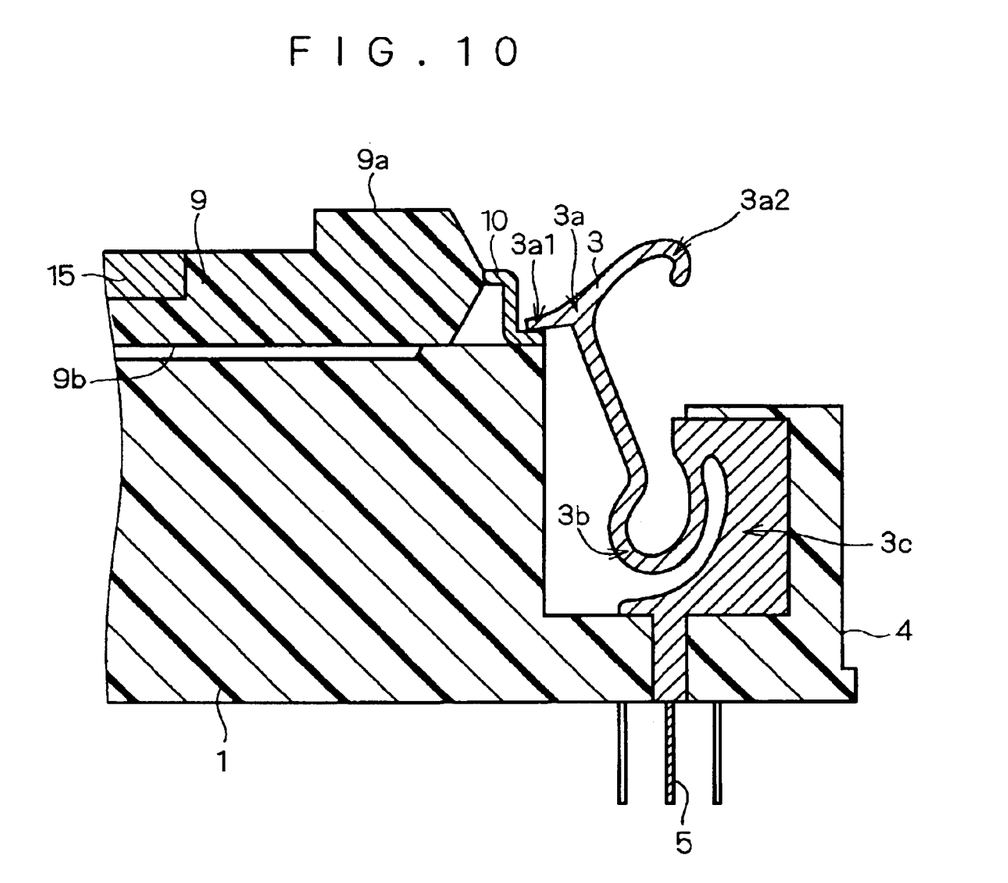
FIG. 10 is a perspective view schematically showing a structure of a socket according to a modification of the first embodiment of the present invention.

Moreover, as shown in FIG. 9, with the socket lid 8 and the socket lever 7 removed from the socket base 1, a secondary electron image on the rear face of the IC chip 15 is observed by the detector 21. Therefore, it becomes possible to drive the detector 21 close to the rear face of the IC chip 15 while preventing the socket lid 8 and the socket lever 7 from causing hindrance. For this reason, it becomes possible to perform analysis and evaluation with high precision by using a high-performance detector having a working distance of not more than 1 mm. Herein, even in the case of a socket of a type that is placed with its top face 9a of the package 9 facing upwardly as described in a modification in FIG. 10, this effect is obtained by detachably attaching the socket lid 8 and the socket lever 7 to the socket base 1.

Second Embodiment

Figure 11:
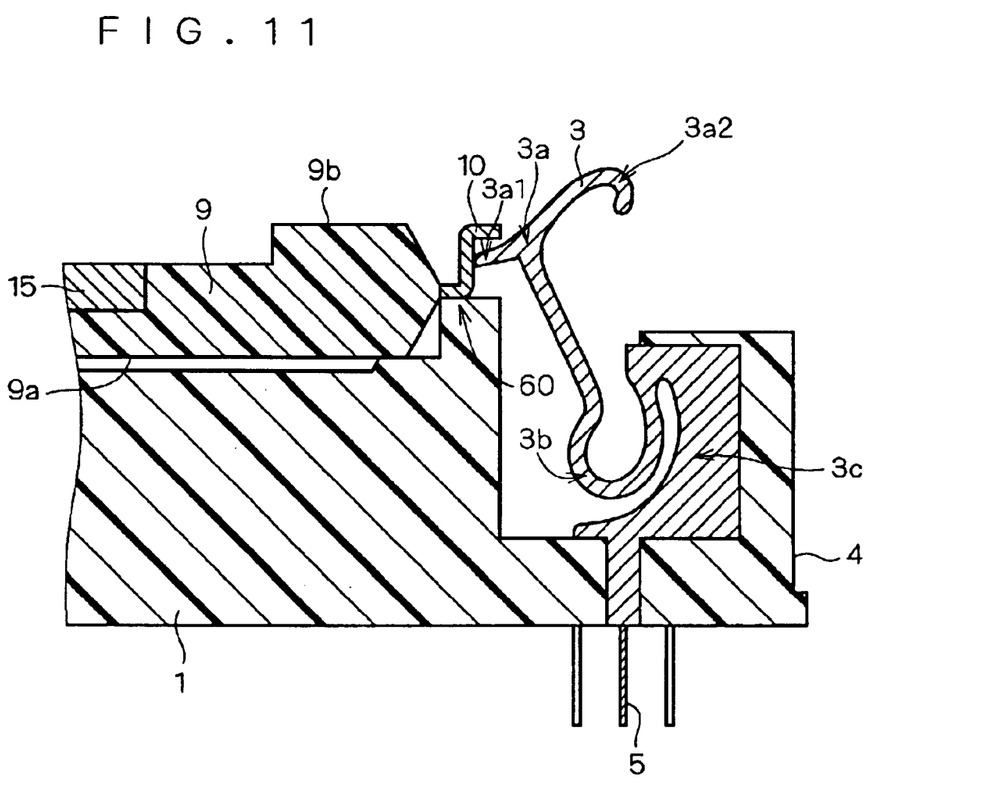
FIG. 11 is a cross-sectional view showing a structure of a socket according to a second embodiment of the present invention.

FIG. 11 is a cross-sectional view showing a structure of a socket according to a second embodiment of the present invention in such a manner as to correspond to FIG. 8. The package 9 is positioned at and housed in a predetermined portion inside the housing part 2 by a positioning structure 60. In the similar manner to the first embodiment, after the package 9 is housed inside the housing part 2, the socket lever 7 and the socket lid 8 are removed from the socket base 1. As shown in FIG. 11, when the socket lever 7 and the socket lid 8 are removed, the socket lead 3 is allowed to press the side face of the package lead 10 from the right side toward the left side in FIG. 11 by its elastic recovering force. Moreover, at the left end of the package 9 which is not shown in FIG. 11, the socket lead 3 is allowed to press the side face of the package lead 10 from the left side toward the right side in FIG. 11.

Figure 12:
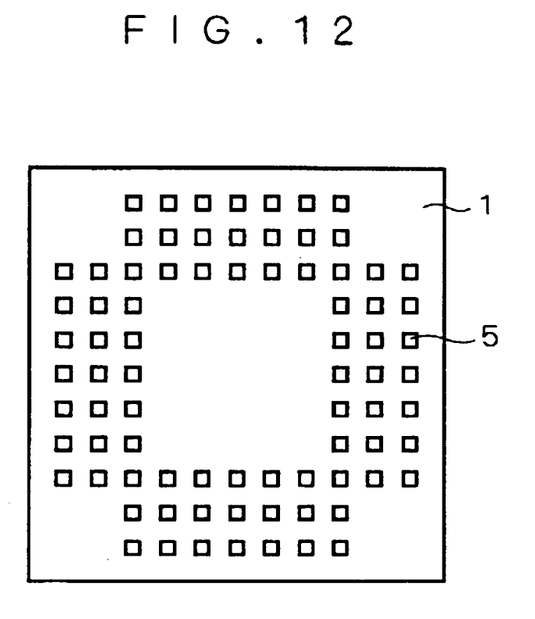
FIG. 12 is a plan view showing a structure of a bottom face of a socket according to a third embodiment of the present invention.

In the socket according to the second embodiment, the package 9 is sandwiched by the pair of socket leads 3 in the horizontal direction, whereby the socket lead 3 and package lead 10 can be securely brought into contact with each other, and the package 9 and the socket base 1 can be mutually fixed Third Embodiment FIG. 12 is a plan view showing a structure of a bottom face of a socket according to a third embodiment of the present invention. The plurality of lead terminals 5 connected to socket leads 3, respectively, are arranged on the bottom face of a socket base 1 with a predetermined layout. The layout of the lead terminals 5 according to the third embodiment may be applied to the sockets according to the first and second embodiments.

Figure 13:
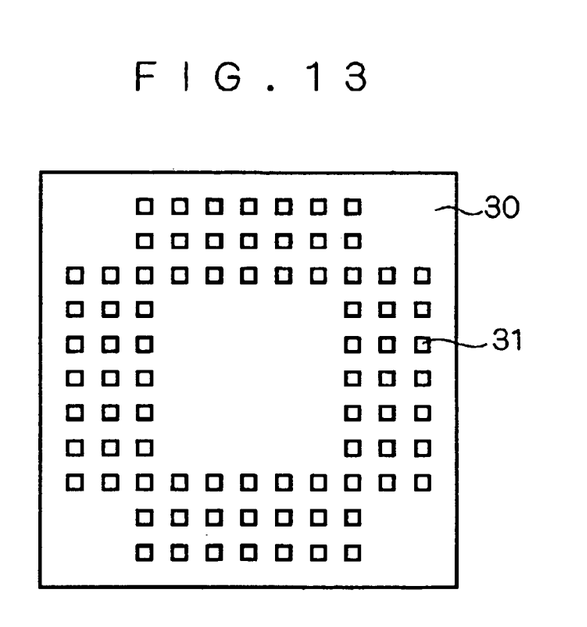
FIG. 13 is a plan view showing a structure of a bottom face of a conventional top face exposed type socket.

FIG. 13 is a plan view showing a structure of a bottom face of a conventional top face exposed-type socket. A plurality of lead terminals 31 connected to socket leads, respectively, are arranged on the bottom face of a socket base 30 with a predetermined layout.

As clearly shown by comparison between FIG. 12 and FIG. 13, the layout of the lead terminals 5 within the bottom face of the socket base 1 is the same as the layout of the lead terminals 31 within the bottom face of the socket base 30.

In the socket according to the third embodiment, since the layout of the lead terminals 5 is made identical to the layout of the conventional top face exposed-type socket so that the conventionally known test board substrate on which the conventional top face exposed-type socket is mounted can be used as the test board substrate 20 shown in FIG. 9. Consequently, it becomes possible to avoid a cost increase due to developing costs of new test board substrates.

While the invention has been shown and described in detail, the foregoing description is in all aspects illustrative and not restrictive. It is therefore understood that numerous modifications and variations can be devised without departing from the scope of the invention.

What is claimed is:

1. A socket comprising:

a socket base;

a housing part formed inside a top face of said socket base, in which a package into which an IC chip is sealed is to be housed in such a manner that a rear face of said package faces upwardly;

a socket lead which is arranged along the periphery of said housing part and has elasticity in a predetermined direction;

a socket lever which is detachably attached to said socket base and has one end meshed with said socket lead; and a socket lid which is detachably attached to said socket base for shifting said socket lead toward the outside of said socket base by pressing the other end of said socket lever.

2. The socket according to claim 1, wherein said socket lead includes a plurality of socket leads, said socket further comprises a plurality of lead terminals formed on a bottom face of said socket base and connected to said plurality of socket leads, respectively.

3. A socket comprising:

a socket base;

a housing part formed inside a top face of said socket base, in which a package into which an IC chip is sealed is to be housed;

a socket lead which is arranged along the periphery of said housing part and elastically recovers in a package lead direction;

a socket lever which is detachably attached to said socket base and has one end meshed with said socket lead; and a socket lid which is detachably attached to said socket base and presses the other end of said socket lever in order to shift said socket lead toward the outside of said socket base.

4. The socket according to claim 3, wherein said package is housed inside said housing part in such a manner that a rear face of said package faces upwardly.

5. The socket according to claim 3, wherein in a state where said package is housed inside said housing part and said socket lever and said socket lid are removed from said socket base, a package lead of said package is pressed by said socket lead and is also sandwiched between said socket lead and said top face of said socket base.

6. The socket according to claim 3, wherein in a state where said package is housed inside said housing part and said socket lever and said socket lid are removed from said socket base, said socket lead presses a package lead of said package from an outside of said socket base toward the inside thereof.

7. The socket according to claim 3, wherein said socket lead includes a plurality of socket leads, said socket further comprises a plurality of lead terminals formed on a bottom face of said socket base and connected to said plurality of socket leads, respectively.

8. A socket comprising:

a socket base;

a housing part formed inside a top face of said socket base, in which a package into which an IC chip is sealed is to be housed in such a manner that a rear face of said package faces upwardly;

a socket lead which is arranged along the periphery of said housing part and has elasticity in a predetermined direction;

a socket lever having a first end meshed with said socket lead; and a socket lid configured to shift said socket lead away from said socket base by pressing a second end of said socket lever, wherein an opening is partially formed in the rear face of said package such that a rear face of said IC chip is preliminarily exposed.

9. The socket according to claim 8, wherein said socket lever is configured without a shaft providing socket lever rotation.

10. A socket comprising:

a socket base;

a housing part formed inside a top face of said socket base, in which a package into which an IC chip is sealed is to be housed;

a socket lead which is arranged along a periphery of said housing part and elastically recovers in a package lead direction;

a socket lever which is detachably attached to said socket base and has a first end meshed with said socket lead; and a socket lid which is detachably attached to said socket base and presses a second end of said socket lever in order to shift said socket lead away from said socket base, wherein an opening is partially formed in a rear face of said package such that a rear face of said IC chip is preliminarily exposed.

11. The socket according to claim 10, wherein said socket lever is configured without a shaft providing socket lever rotation.

* * * * *